United States Patent
Suzuki

(10) Patent No.: US 8,756,542 B2
(45) Date of Patent: Jun. 17, 2014

(54) LSI DESIGN SUPPORT DEVICE AND LSI DESIGN METHOD

(71) Applicant: Renesas Electronics Corporation, Kanagawa (JP)

(72) Inventor: Keiichi Suzuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/847,572

(22) Filed: Mar. 20, 2013

(65) Prior Publication Data

US 2013/0275929 A1 Oct. 17, 2013

(30) Foreign Application Priority Data

Apr. 11, 2012 (JP) ................. 2012-089912

(51) Int. Cl.
*G06F 17/50* (2006.01)
(52) U.S. Cl.
USPC .......................................... 716/104
(58) Field of Classification Search
USPC .......................................... 716/104
See application file for complete search history.

(56) References Cited

U.S. PATENT DOCUMENTS 5,696,771 A * 12/1997 Beausang et al. .............. 714/726
2008/0208559 A1 * 8/2008 Koelbl et al. ................... 703/16

FOREIGN PATENT DOCUMENTS

JP 2007-213456 A 8/2007

* cited by examiner

*Primary Examiner* — Suresh Memula
(74) *Attorney, Agent, or Firm* — Mattingly & Malur, PC

(57) ABSTRACT

In an LSI designing support device and method, in which in an LSI circuit is designed including a logic gate and an FET, a possibility that a steady-state flow-through current from a power source to a ground is generated is determined. In an inputted netlist including a logic gate and an FET, extraction is made of a flow-through condition function which expresses, in terms of a Boolean expression, on/off of an FET arranged in a path from a power source to a ground or a path from the output of a logic gate to the power source or to the ground. A flow-through condition determining Boolean expression of a logic circuit which supplies an input to the flow-through condition function is extracted. The Boolean expression is degenerated with logic equivalence maintained, and the existence or nonexistence of a possibility of satisfying a flow-through condition is determined.

16 Claims, 11 Drawing Sheets

N-TYPE MOSFET

P-TYPE MOSFET

PARALLEL COUPLING

SERIES COUPLING

FIG. 3A
NETLIST
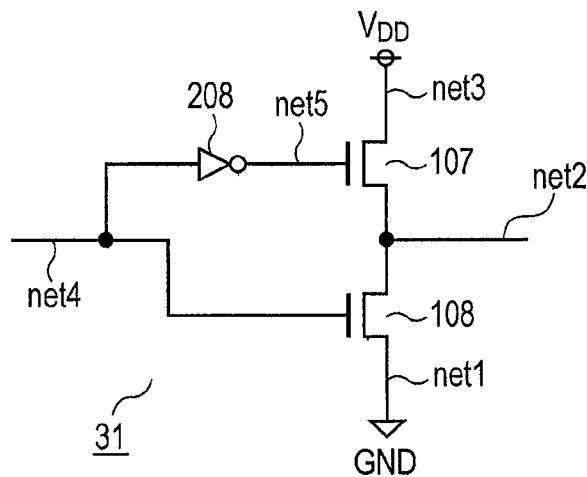
FIG. 3B
MODELING
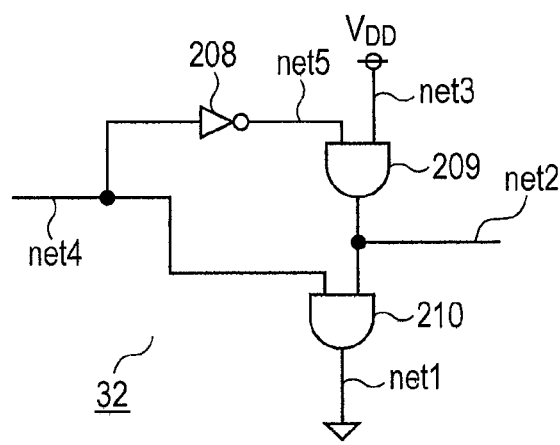
FIG. 3C
BOOLEAN EXPRESSION OPERATION
FLOW-THROUGH CONDITION:
= net4 & net2
= net4 & (net5 & net3)
= net4 & (!net4 & high)
= 0
33

EXAMPLE 1

EXAMPLE 2

EXAMPLE 3

EXAMPLE 1 OF CREATING GND SIDE BOOLEAN EXPRESSION

EXAMPLE 2 OF CREATING GND SIDE BOOLEAN EXPRESSION

EXAMPLE 1 OF CREATING PWR SIDE BOOLEAN EXPRESSION

TARGET NET net30
= !net32 & net31 (high)
= !net32

EXAMPLE 2 OF CREATING PWR SIDE BOOLEAN EXPRESSION

TARGET NET net34
= net38 & net35 | net37 & net36 (high)
= net38 & (net39 & net36) | net37 & net36
= net38 & (net39 & high) | net37 & high
= net38 & net39 | net37

NMOS WITH PWR ATTRIBUTE OR SIG ATTRIBUTE

PMOS WITH PWR ATTRIBUTE OR SIG ATTRIBUTE

NMOS WITH GND ATTRIBUTE

PMOS WITH GND ATTRIBUTE

NETLIST INCLUDING TRANSISTOR

PMOS WITH PWR ATTRIBUTE IS CONVERTED INTO AND WITH ONE INVERTED INPUT

LSI DESIGN SUPPORT DEVICE AND LSI DESIGN METHOD

CROSS-REFERENCE TO RELATED APPLICATIONS

The disclosure of Japanese Patent Application No. 2012-089912 filed on Apr. 11, 2012 including the specification, drawings and abstract is incorporated herein by reference in its entirety.

BACKGROUND

The present invention relates to a design support device of an LSI and a design method of an LSI, and can be utilized suitably in particular in determining a possibility of generation of a steady-state flow-through current from a power source to a ground.

A CMOS logic circuit is designed so that a circuit comprised of a P-type FET on a power supply side and a circuit comprised of an N-type FET on a ground side may not be set to an ON state concurrently, and a flow-through current does not flow in a steady state excluding a transient state as long as the outputs of plural logic gates are not short-circuited. On the other hand, some circuit is designed by employing a P-type FET and an N-type FET, intermingled with other CMOS logic circuits, without forming a CMOS logic circuit. One example of such a case is a circuit in which a pull-up and pull-down circuit and an analog circuit are intermingled with a CMOS logic circuit.

In such a circuit, there exists a possibility that a steady-state flow-through current may flow, in states where all the transistors in a path from a power source to a ground are set to ON, and where the output of a logic circuit which outputs LOW as a logical value is pulled up or conversely the output of a logic circuit which outputs HIGH as a logical value is pulled down. Such a state is brought about basically due to a design error; however, once such a circuit is made in a design phase, it is not easy to detect it by a simulation, etc.

Patent Literature 1 discloses a high impedance detecting method which can detect a flow-through current in a circuit by a simulation for an analog circuit including a transistor (refer to paragraphs 0031-0067). About a certain net in an integrated circuit, the disclosed technology extracts whether there exists the state in which a flow-through current is generated because of the net having high impedance and it also extracts that under what conditions a flow-through current is generated. Furthermore, the disclosed technology extracts whether there exists the state in which the net has high impedance, and also extracts that under what conditions the net becomes in the state of high impedance. When the extracted condition of the flow-through current and the extracted condition of the high impedance are both satisfied during the simulation execution, the flow-through current due to the high impedance is detected.

(Patent Literature)
(Patent Literature 1) Published Japanese Unexamined Patent Application No. 2007-213456

SUMMARY

The invention disclosed by Patent Literature 1 monitors whether the extracted condition of the flow-through current and the extracted condition of the high impedance are both satisfied during the simulation execution. Therefore, if the input state given in the simulation includes what satisfies the flow-through current condition and the high impedance condition, it is possible to detect that the flow-through current is generated. However, if what satisfies the conditions is not included in the input state given in the simulation, it becomes difficult to detect that there is a possibility that a flow-through current may be generated.

In order to detect the occurrence or non-occurrence of a possibility that a flow-through current may be generated, not based on the input state nor on the input pattern in the simulation, but more comprehensively, it is necessary to adopt a static technique instead of a dynamic technique like the simulation.

A solution to the problem described above will be explained in the following, and a solution to other problems and new features will be also clarified from description of the specification and the accompanying drawings of the present invention.

According to one embodiment, the present invention is as follows.

That is, in the inputted netlist including a logic gate and an FET, a flow-through condition function in terms of a Boolean expression expressing on and off of the FET arranged in a path from a power source to a ground or from an output of the logic gate to the power source or to the ground is extracted. A Boolean expression of a logic circuit which gives an input to the flow-through condition function is extracted, the Boolean expression is degenerated with the logic equivalence maintained, and the occurrence or non-occurrence of a possibility that the flow-through conditions may be satisfied is determined.

The effect obtained by the embodiment is explained briefly as follows.

That is, it is possible to extract a part which has a possibility that a steady-state flow-through current may be generated, not based on the input conditions nor on the input pattern, but statically and comprehensively.

BRIEF DESCRIPTION OF THE DRAWINGS

FIGS. 3A, 3B, and 3C are drawings illustrating an example of having confirmed whether a flow-through current is generated in a netlist, using the LSI design support device according to Embodiment 1;

DETAILED DESCRIPTION

1. Outline of Embodiments

Figure 1:
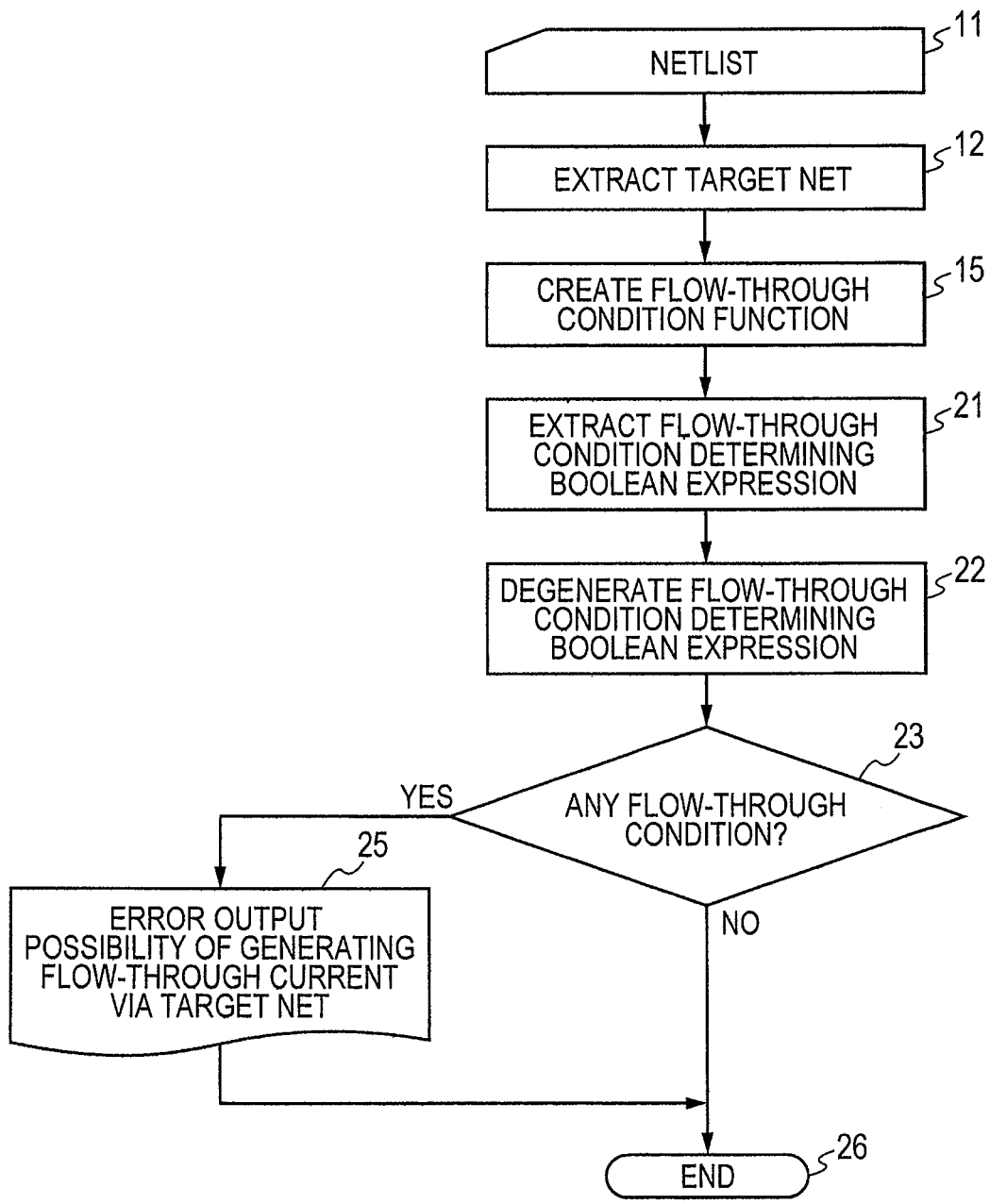
FIG. 1 is a flowchart illustrating an outline of a process flow executed by an LSI design support device according to Embodiment 1.

First, an outline of a typical embodiment disclosed in the present application is explained. A numerical symbol of the drawing referred to in parentheses in the outline explanation about the typical embodiment only illustrates what is included in the concept of the component to which the numerical symbol is attached.

(1)<Determination of Flow-Through Current by Means of a Flow-Through Condition Function and a Flow-Through Condition Determining Boolean Expression>

Provided is a LSI design support device which inputs a netlist of a circuit including a logic gate and an FET (11) and determines a possibility that a steady-state flow-through current may be generated in the circuit. The LSI design support device operates as follows.

A flow-through condition function in the netlist is created (15), by obtaining a Boolean expression indicating function of a circuit of which an output is a source terminal or a drain terminal of a grounded FET. A flow-through condition determining Boolean expression is created (21), by extracting from the netlist a Boolean expression indicating function of a partial netlist which supplies an input to the flow-through condition function.

The flow-through condition function and the flow-through condition determining Boolean expression are obtained by performing logic modeling in which, in the netlist, a power supply terminal is replaced with a logical value 1, a P-type FET is replaced with a logic gate which outputs to a drain a logical value inputted into a source when a logical value 0 is inputted to a gate, and an N-type FET is replaced with a logic gate which outputs to a source a logical value inputted into a drain when a logical value 1 is inputted to a gate.

Occurrence or non-occurrence of the logic state of the netlist which generates a steady-state flow-through current in a grounded FET included in the netlist is determined (25), by determining existence of the conditions (23) in which a logical value 1 is outputted from the flow-through condition function, based on the result of having degenerated the flow-through condition determining Boolean expression with the logical equivalence maintained (22).

Accordingly, it is possible to determine the occurrence or non-occurrence of a possibility that a steady-state flow-through current may be generated, statically and comprehensively, irrespective of input conditions or an input pattern.

(2)<A GND Side Boolean Expression and a PWR Side Boolean Expression>

In Paragraph 1, a signal net coupled only to a source or a drain of plural FETs among plural signal nets included in the netlist is defined as a target net (12), and the following processing is performed for each of all the target nets (13, 24).

A path which starts from the target net, passes through a path from a drain to a source of an FET, and reaches a ground net is extracted, the logic modeling is performed to the FET in the path, and a GND side Boolean expression, which describes a gate of the FET in the path and the target net as an input and the ground net as an output, is extracted (16).

A path which starts from the target net, passes through a path from a drain to a source of an FET, and reaches a power net or a signal net coupled to other than an FET is extracted, the logic modeling is performed to the FET in the path, and a PWR side Boolean expression, which describes a gate of an FET in the path as an input and the target net as an output, is extracted (17).

A Boolean expression obtained by combining the GND side Boolean expression and the PWR side Boolean expression with the target net is defined as the flow-through condition function (18). When there exists a condition under which both the PWR side Boolean expression and the GND side Boolean expression become a logical value 1, it is determined that there exists a logic state of the netlist which generates a steady-state flow-through current (23, 25).

Accordingly, when either the PWR side Boolean expression or the GND side Boolean expression becomes a logical value 0, there is no possibility that a flow-through current flows; therefore, determining of the flow-through condition determining Boolean expression becomes easy.

(3)<A Flow-Through Condition Determining Boolean Expression (Search of a Joining Net)>

In Paragraph 2, starting from a signal net as the input of the GND side Boolean expression and the PWR side Boolean expression, a path search is performed for the netlist in the direction from an output terminal to an input terminal of a logic gate, or in the direction from a drain or a source to a gate of an FET (19), and a Boolean expression indicating the function and connecting relation of a logic gate or an FET on the path is extracted and defined as the flow-through condition determining Boolean expression (21).

When the path search reaches a joining net at which a path searched in the path search starting from the signal net as the input of the GND side Boolean expression and a path searched in the path search starting from the signal net as the input of the PWR side Boolean expression join, the path search subsequent to the joining net is stopped.

Accordingly, determining of the flow-through condition determining Boolean expression (23) becomes easy.

(4)<Error Processing in Case of No Joining Net Extracted>

In Paragraph 3, when the joining net is not extracted as a result of performing the path search of the specified number of stages, it is determined that there exists a logic state of the netlist which generates a steady-state flow-through current in the flow-through current path passing through the target net (20).

Accordingly, it is possible to perform an error output processing promptly (25) and to shift to the processing of the next target net. Therefore, it is possible to reduce the processing time.

(5)<Degeneration of a Flow-Through Condition Function and a Flow-Through Condition Determining Boolean Expression>

In Paragraph 3, a Boolean expression, obtained by combining the flow-through condition function and the flow-through condition determining Boolean expression, is degenerated with the logical equivalence maintained (22), and when the Boolean expression for which further degeneration is impracticable shows a value other than a logical value 0 (23), it is determined that there exists a logic state of the netlist which generates a steady-state flow-through current (25).

Accordingly, it is possible to easily determine the flow-through conditions.

(6)<Utilization of a Binary Decision Diagram (BDD)>

In Paragraph 5, the Boolean expression obtained by combining the flow-through condition function and the flow-through condition determining Boolean expression is expressed by means of a binary decision diagram.

Accordingly, it is possible to determine the flow-through conditions easily and reliably. This is because an irreducible binary decision diagram is degenerated to a unique form, as long as it is functionally equivalent, and accordingly it is possible to reliably detect that the Boolean expression becomes a logical value 0.

(7)<Logic Simulation of a Flow-Through Condition Function and a Flow-Through Condition Determining Boolean Expression>

In Paragraph 3, a logic simulation is performed by inputting all the combination patterns of the input conditions to the Boolean expression obtained by combining the flow-through condition function and the flow-through condition determining Boolean expression, and when there exists a combination of the input conditions under which the Boolean expression outputs a logical value 1, it is determined that there exists a logic state of the netlist which generates a steady-state flow-through current.

Accordingly, it is possible to identify an input pattern which generates a flow-through current, and it becomes easy to make the design change for preventing the generation of a flow-through current.

(8)<Incorporation into a Dynamic Simulation>

In Paragraph 3, the Boolean expression obtained by combining the flow-through condition function and the flow-through condition determining Boolean expression is incorporated into a dynamic simulation to the netlist.

Accordingly, it is possible to monitor the generation of a flow-through current in the ordinary dynamic simulation, and to carry on the design by treating the generation of a flow-through current equally with a logic bug, in the logical design stage. Therefore, it is possible to complete the circuit design which does not generate a flow-through current, concurrently with the convergence of debugging in the logical design.

(9)<Flow-Through Current Determination by Means of a Flow-Through Condition Function and a Flow-Through Condition Determining Boolean Expression>

Provided is an LSI design method for inputting a netlist of a circuit including a logic gate and an FET (11) and for determining by a computer the occurrence or non-occurrence of a logic state of the netlist which generates a steady-state flow-through current in a grounded FET included in the netlist. The LSI design method is configured as follows.

The LSI design method includes a first step for creating a flow-through condition function in the netlist, by obtaining a Boolean expression indicating function of a circuit of which an output is a source terminal or a drain terminal of a grounded FET (15), and a second step for creating a flow-through condition determining Boolean expression, by extracting from the netlist a Boolean expression indicating function of a partial netlist which supplies an input to the flow-through condition function (21).

The LSI design method further includes a third step for determining occurrence or non-occurrence of the logic state of the netlist which generates a steady-state flow-through current in a grounded FET included in the netlist, by determining existence of the conditions in which a logical value 1 is outputted from the flow-through condition function, based on the result of having degenerated the flow-through condition determining Boolean expression with the logical equivalence maintained (23).

The first step and the second step include respectively a step for performing logic modeling in which, in the netlist, a power supply terminal is replaced with a logical value 1, a P-type FET is replaced with a logic gate which outputs to a drain a logical value inputted into a source when a logical value 0 is inputted to a gate, and an N-type FET is replaced with a logic gate which outputs to a source a logical value inputted into a drain when a logical value 1 is inputted to a gate.

Accordingly, it is possible to determine the occurrence or non-occurrence of a possibility that a steady-state flow-through current may be generated, statically and comprehensively, irrespective of input conditions or an input pattern.

(10)<A GND Side Boolean Expression and a PWR Side Boolean Expression>

In Paragraph 9, a signal net coupled only to a source or a drain of plural FETs among plural signal nets included in the netlist is defined as a target net (12), and the first step, the second step, and the third step are repeatedly executed for each of all the target nets (13,24).

The first step includes a step of extracting a path which starts from the target net, passes through a path from a drain to a source of an FET, and reaches a ground net, performing the logic modeling to the FET in the path, and extracting a GND side Boolean expression which describes a gate of the FET in the path and the target net as an input and the ground net as an output (17). The first step further includes a step of extracting a path which starts from the target net, passes through a path from a drain to a source of an FET, and reaches a power net or a signal net coupled to other than an FET, performing the logic modeling to the FET in the path, and extracting a PWR side Boolean expression which describes a gate of the FET in the path as an input and the target net as an output (17). The first step further includes a step of defining a Boolean expression obtained by combining the GND side Boolean expression and the PWR side Boolean expression with the target net as the flow-through condition function (18).

The third step determines that there exists a logic state of the netlist which generates a steady-state flow-through current, when there exists a condition under which both the PWR side Boolean expression and the GND side Boolean expression become a logical value 1 (23, 25).

Accordingly, when either the PWR side Boolean expression or the GND side Boolean expression becomes a logical value 0, there is no possibility that a flow-through current flows; therefore, determining of the flow-through condition determining Boolean expression becomes easy.

(11)<A Flow-Through Condition Determining Boolean Expression (Joining Net Search)>

In Paragraph 10, the second step includes a step of performing a path search for the netlist, starting from a signal net as the input of the GND side Boolean expression and the PWR side Boolean expression, in the direction from an output terminal to an input terminal of a logic gate, or in the direction from a drain or a source to a gate of an FET (19). The second step further includes a step of extracting a Boolean expression indicating the function and connecting relation of a logic gate or an FET on the path, and defining it as the flow-through condition determining Boolean expression (21). The path search subsequent to a joining net is stopped, when the path search reaches the joining net at which a path searched in the path search starting from the signal net as an input of the GND side Boolean expression and a path searched in the path search starting from the signal net as an input of the PWR side Boolean expression join.

Accordingly, determining of a flow-through condition determining Boolean expression becomes easy.

(12)<Error Processing in Case of No Joining Net Extracted>

In Paragraph 11, the LSI design method further includes a fourth step of determining that there exists a logic state of the netlist which generates a steady-state flow-through current in the flow-through current path passing through the target net, when the joining net is not extracted as a result of performing the path search of the specified number of stages (20).

Accordingly, it is possible to perform an error output processing promptly and to shift to the processing of the next target net. Therefore, it is possible to reduce the processing time.

(13)<Degeneration of a Flow-Through Condition Function and a Flow-Through Condition Determining Boolean Expression>

In Paragraph 11, the LSI design method further includes a fifth step of degenerating a Boolean expression obtained by combining the flow-through condition function and the flow-through condition determining Boolean expression with the logical equivalence maintained (22), and in the LSI design method, the third step determines that there exists a logic state of the netlist which generates a steady-state flow-through current (25), when the Boolean expression for which further degeneration in the fifth step is impracticable shows a value other than a logical value 0 (23).

Accordingly, it is possible to easily determine the flow-through conditions.

(14)<Utilization of a Binary Decision Diagram (BDD)>

In Paragraph 13, the Boolean expression obtained by combining the flow-through condition function and the flow-through condition determining Boolean expression is expressed by means of a binary decision diagram.

Accordingly, it is possible to determine the flow-through conditions easily and reliably. This is because an irreducible binary decision diagram is degenerated to a unique form, as long as it is functionally equivalent, and accordingly it is possible to reliably detect that the Boolean expression becomes a logical value 0.

(15)<Logic Simulation of a Flow-Through Condition Function and a Flow-Through Condition Determining Boolean Expression>

In Paragraph 11, the LSI design method further includes a sixth step of performing a logic simulation to the Boolean expression obtained by combining the flow-through condition function and the flow-through condition determining Boolean expression, by inputting all the combination patterns of the input conditions. In the LSI design method, the third step determines that there exists a logic state of the netlist which generates a steady-state flow-through current, when there exists a combination of the input conditions under which the Boolean expression outputs a logical value 1.

Accordingly, it is possible to identify an input pattern which generates a flow-through current, and it becomes easy to make the design change for preventing the generation of a flow-through current.

(16)<Incorporation into a Dynamic Simulation>

In Paragraph 11, the Boolean expression obtained by combining the flow-through condition function and the flow-through condition determining Boolean expression is incorporated in a dynamic simulation to the netlist.

Accordingly, it is possible to monitor the generation of a flow-through current in the ordinary dynamic simulation, and to carry on the design by treating the generation of a flow-through current equally with a logic bug, in the logical design stage. Therefore, it is possible to complete the circuit design which does not generate a flow-through current, concurrently with the convergence of debugging in the logical design.

2. Details of Embodiments

The embodiments are further explained in full detail.

Embodiment 1

FIG. 1 is a flow chart illustrating an outline of a process flow executed by an LSI design support device according to Embodiment 1.

Figure 2A:
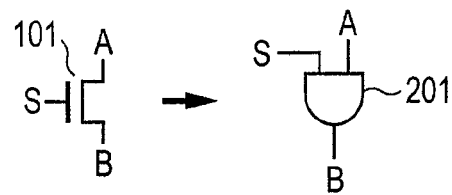
FIGS. 2A, 2B, 2C, and 2D are explanatory diagrams illustrating examples of logic modeling for FETs by means of logic gates.
Figure 2B:
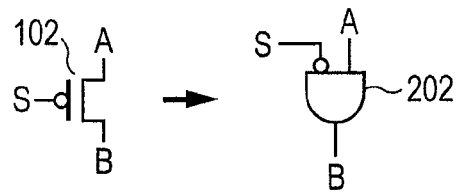
Figure 2C:
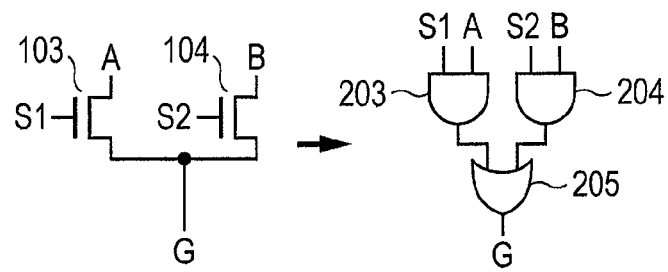
Figure 2D:
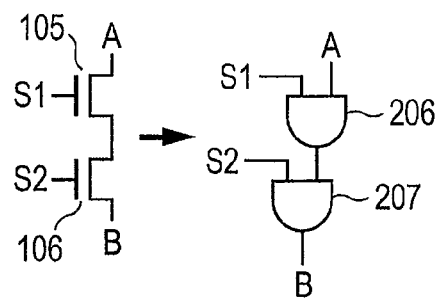

A netlist including a logic gate and an FET is inputted (Step 11). All the nets included in the inputted netlist are classified into a power net which is coupled to a power supply terminal, a ground net which is grounded, and others as a signal net. Next, modeling is performed, in which the power net is replaced with a logical value 1 and the FET is replaced with a logic gate. FIGS. 2A, 2B, 2C, and 2D are explanatory diagrams illustrating examples of logic modeling for FETs by means of logic gates. As illustrated in FIG. 2A, an N-type FET 101 is replaced with an AND gate 201 which outputs to a source B a logical value inputted into a drain A, when a logical value 1 is inputted into a gate S. As illustrated in FIG. 2B, a P-type FET 102 is replaced with an AND gate 202 provided with inverting function at an S terminal, which outputs to a drain B a logical value inputted into a source A, when a logical value 0 is inputted into a gate S. When FETs are coupled in parallel, the logic modeling is performed as illustrated in FIG. 2C, in which the FETs are replaced with a selector which is configured with logic gates 203, 204, and 205, inputting into the AND gate 203 a gate S1 and a drain A of the FET 103 and into the AND gate 204 a gate S2 and a drain B of the FET 104, respectively, the FET 103 and the FET 104 being coupled in parallel. When FETs are coupled in series, the logic modeling is performed as illustrated in FIG. 2D, in which the FETs are replaced with a cascade connection of an AND gate 206 to which a gate S1 and a drain A of an FET 105 in a preceding stage are inputted, and an AND gate 207 to which an output of the AND gate 206 and a gate S2 of an FET 106 in a latter stage are inputted. By the present logic modeling, a Boolean expression which describes zero or more signal nets as an input and one or more ground nets as an output is extracted from the inputted netlist as a flow-through condition function (Step 15). Furthermore, a flow-through condition determining Boolean expression is obtained by extracting, as a Boolean expression, a logic circuit which supplies an input to the flow-through condition function (Step 21). When the conditions under which a logical value 1 is outputted to a ground net of the flow-through condition function exist (Step 23), it is determined that there is a possibility that a flow-through current may flow in the circuit expressed by the netlist (Step 25). By degenerating the flow-through condition determining Boolean expression with the logical equivalence maintained (Step 22), it is not necessary to perform the simulation by inputting all the combinations of inputs; accordingly, it is possible to determine the occurrence or non-occurrence of a possibility that a steady-state flow-through current may be generated, statically and comprehensively, irrespective of input conditions or an input pattern.

FIGS. 3A, 3B, and 3C are drawings illustrating an example of having confirmed whether a flow-through current is generated in a netlist, using the LSI design support device according to Embodiment 1. FIG. 3A illustrates an inputted netlist 31. NMOSFETs 107 and 108 are coupled in series between a power source VDD and a ground GND, and are driven by a logic circuit of an inverter 208. FIG. 3B illustrates a logic circuit 32 which has modeled the two FETs, in order to obtain a flow-through condition function from the netlist illustrated in FIG. 3A. As described above, the N-type FETs 107 and 108 are replaced with AND gates 209 and 210 which output to a source the logical value inputted into a drain when a logical value 1 is inputted into a gate, and the input is given by the power source and the input or the output of a logic gate, and the output is given by a net1 coupled to the GND. What the present modeling is expressed by the Boolean expression is a flow-through condition function illustrated in FIG. 3C. Here, in the present specification, "&" expresses an AND logic, "|" expresses an OR logic, and "!" expresses a NOT logic, and the positive logic is adopted in which a potential "high" is expressed by a logical value 1 and a potential "low" is expressed by a logical value 0. Defining the net1 of the grounding point GND as the output, the flow-through condition is expressed by net1=net4 & net2. From the AND gate 209, net2=net5 & net3, and the net3 of the power source VDD is replaced with a "high" as a logical value 1, and from the inverter 208, net5=!net4. Substituting these relations, the output of the net1 at the grounding point GND is calculated to be a logical value 0. Therefore, in the present case, there is no possibility that the flow-through current is generated. On the other hand, when the output is other than a logical value 0, it means that there is a possibility that a logical value 1 may be outputted to the net1 coupled to the GND; therefore, it is determined that there is a possibility that a flow-through current may be generated.

Figure 4:
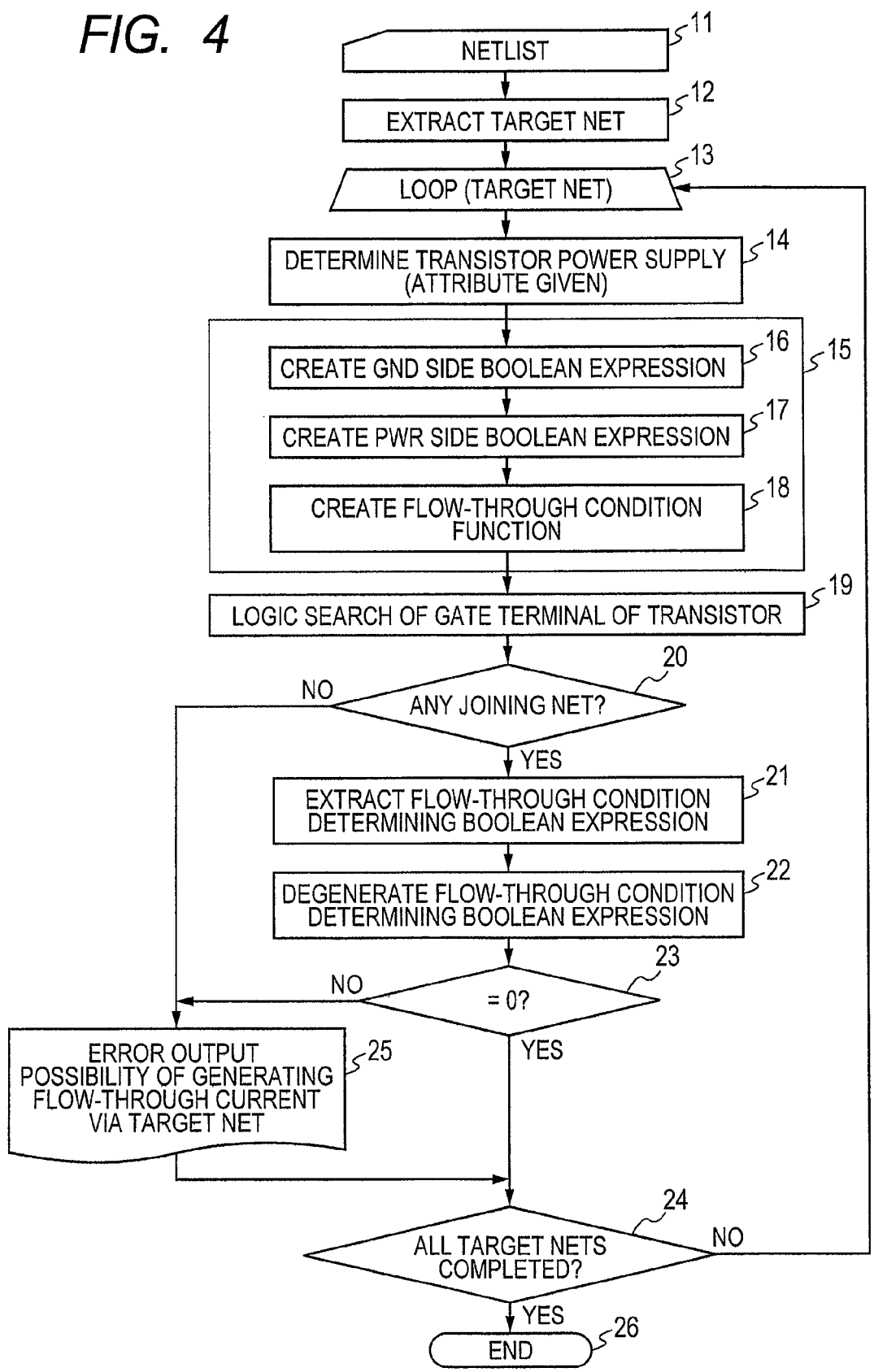
FIG. 4 is a flow chart illustrating the details of the process flow executed by the LSI design support device according to Embodiment 1.

FIG. 4 is a flow chart illustrating the details of the process flow executed by the LSI design support device according to Embodiment 1.

When a netlist is inputted (Step 11), a target net is extracted (Step 12). In a circuit net including a transistor (MOSFET) and a macroblock, such as a logic gate, a memory device, etc., a net coupled to two or more source terminals or drain terminals of transistors is defined as a check target net. When the net is coupled to something other than a source terminal and a drain terminal of a transistor (a logic gate, a memory device, an external pin, etc.), the net is removed from the check target net.

Starting from the target net, a transistor is searched for. The search is made from a source terminal to a drain terminal of a transistor or from a drain terminal to a source terminal, but the search does not made to a gate terminal. The search is made until it reaches a power source (a PWR such as a VDD and a VCC or a grounding point GND), a gate output, or an external input terminal, and the attribute of PWR, GND, and SIG is given to the passed transistor. When a power source (VDD) is finally reached, a PWR attribute is given, when a grounding point (GND) is finally reached, a GND attribute is given, and otherwise a SIG attribute is given. In the case where the attribute to be given to a transistor overlaps, when the overlapped attributes are same (PWR and PWR, for example), the attribute (PWR attribute) is given, and when the overlapped attributes are different, a SIG attribute is given.

Figure 5A:
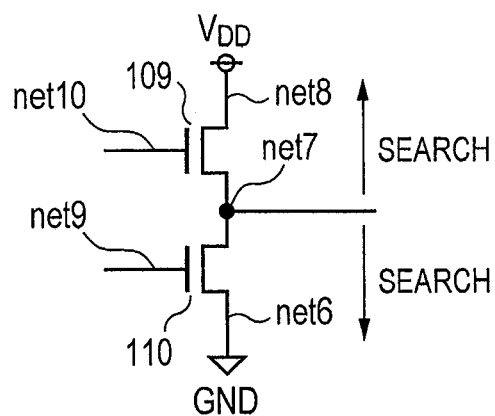
FIGS. 5A, 5B, and 5C are explanatory diagrams illustrating an example of determining processing (Step 14) of a transistor power supply.
Figure 5B:
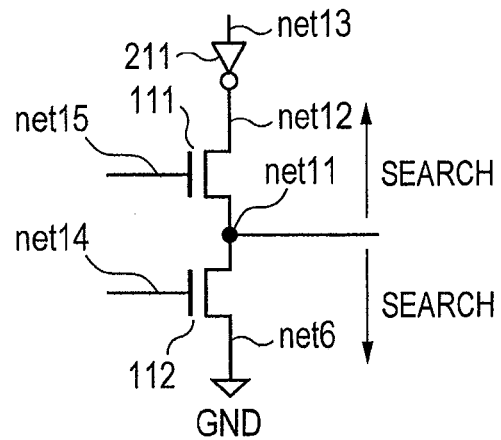
Figure 5C:
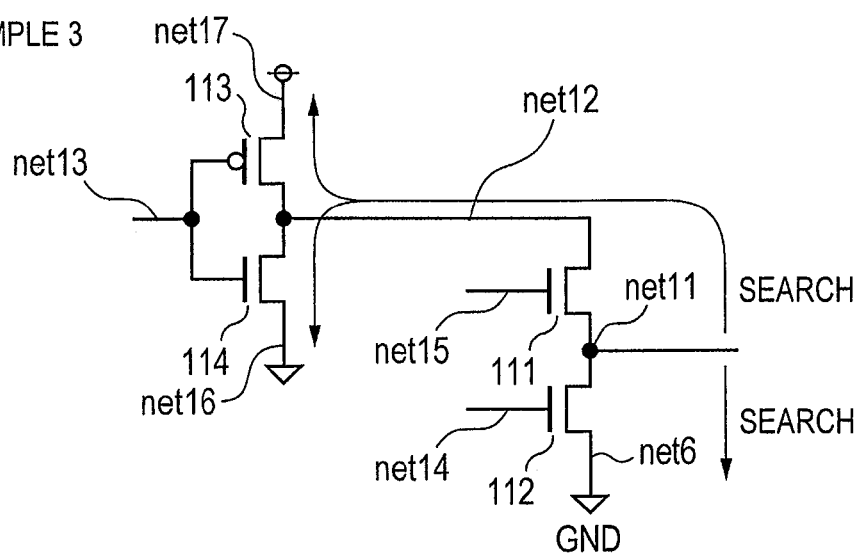

FIGS. 5A, 5B, and 5C are explanatory diagrams illustrating an example of determining processing (Step 14) of a transistor power supply. In Example 1 as illustrated in FIG. 5A, an NMOS 109 and an NMOS 110 are coupled in series between the VDD and the GND. Since a net7 corresponds to a net coupled to two or more of a source terminal or a drain terminal of a transistor, the net7 is a check target net. The search for a transistor is made from the net7 as the starting point. When the search is made to the direction of the PWR side, the search passes the NMOS 109 and reaches a net8 as the power source. Therefore, the PWR attribute is given to the NMOS 109. When the search is made to the direction of the GND side, the search passes the NMOS 110 and reaches a net6 as the GND. Therefore, the GND attribute is given to the NMOS 110. The search is not made to the direction of a net10 and a net9 which are gate terminals of the NMOS 109 and the NMOS 110. Example 2 illustrated in FIG. 5B is a netlist in which two NMOSs 111 and 112 are coupled in series. Since a net11 is a target net, the search is made from the net11 in the direction of the GND, and the GND attribute is given to the NMOS 112, as is the case with Example 1 illustrated in FIG. 5A. When the search is made from the net11 as a starting point in the direction of the PWR side, the search passes the NMOS 111 and reaches a net12. Since the net12 is an output of an inverter 211, the SIG attribute is given to the NMOS 111. Example 3 illustrated in FIG. 5C is a modified example in which the inverter 211 in Example 2 illustrated in FIG. 5B is described in terms of transistors 113 and 114. When the search is made further from the net12 to the direction of the PMOS 113, the search passes the PMOS 113 and reaches the power source VDD. Therefore, the PWR attribute is given to the PMOS 113. On the other hand, when the search is made in the direction of the NMOS 114, the search passes the NMOS 114 and reaches the GND. Therefore, the GND attribute is given to the NMOS 114. Eventually, the search from the NMOS 111 reaches the PWR and the GND; accordingly, the SIG attribute is given to the NMOS 111.

Next, the Boolean function as a flow-through condition is created (Step 15). In further details, a GND side Boolean expression is created (Step 16), a PWR side Boolean expression is created (Step 17), and a flow-through condition function is obtained by combining them (Step 18). In Example 1 illustrated in FIG. 5A, the GND side Boolean expression is given by flow-through condition=net9 & net7, and the PWR side Boolean expression is given by net7=net10 & net8 (high).

The flow-through condition function obtained by combining them is given by flow-through condition=net9 & net7=net9 & net10 & net8 (high)=net9 & net10.

In Example 2 illustrated in FIG. 5B, the GND side Boolean expression is given by, as is the case with Example 1 illustrated in FIG. 5A, flow-through condition=net11 & net14.

However, the PWR side Boolean expression has a case where the net12 becomes a logical value 1 and a case where the net12 becomes a logical value 0, therefore, as for the NMOS 111 of the SIG attribute, it is necessary to evaluate both cases of the GND attribute and the PWR attribute. The PWR side Boolean expression evaluates both of:

a case of the GND attribute: net11=net15 & net12 (low), and a case of the PWR attribute: net11=net15 & net12 (high).

The flow-through condition function obtained by combining for the case where the NMOS 111 has the GND attribute is given by flow-through condition=net15 & net12 (low) & net14=net15 & 0 & net14=0.

Therefore, a flow-through current is not generated.

The flow-through condition function obtained by combining for the case where the NMOS 111 has the PWR attribute is given by flow-through condition=net15 &net12 (high) & net14=net15 & net14.

Therefore, there is a possibility that a flow-through current may be generated under the conditions that both the net14 and the net15 are set to 1.

Creation of the GND side Boolean expression (Step 16) and creation of the PWR side Boolean expression (Step 17) will be explained still in detail, referring to another example.

Figure 6A:
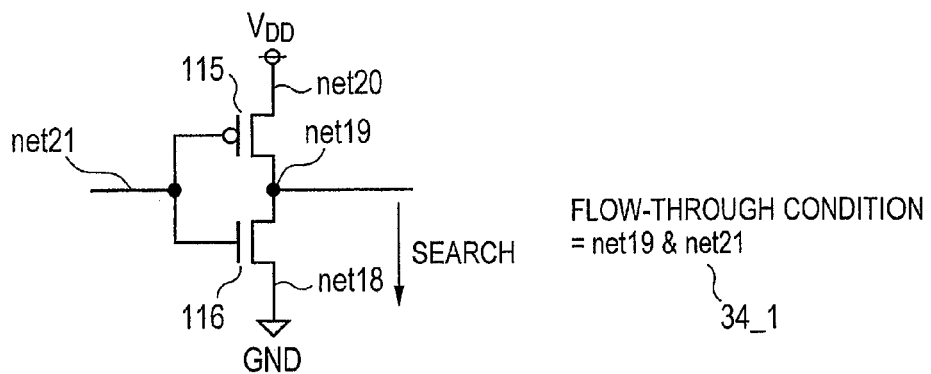
FIGS. 6A and 6B are explanatory diagrams illustrating an example of creation of a GND side Boolean expression (Step 16)
Figure 6B:
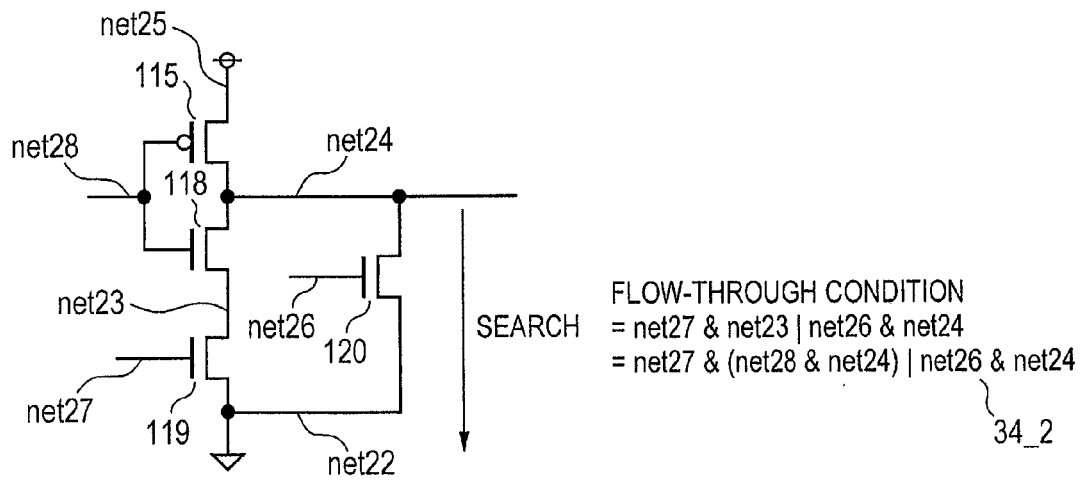

In the creation of the GND side Boolean expression (Step 16), the search is made, starting from the target net, from a drain to a source or from a source to a drain of a transistor to which the GND attribute or the SIG attribute is given. The search is continued until it reaches the GND, a terminal of a macroblock such as a logic gate or a memory, or an input/output port provided for the exterior of the LSI. As for a transistor passed in process of the search, logic modeling is performed in which, as illustrated in FIGS. 2A-2D, an NMOS is converted into an AND gate (FIG. 2A), a PMOS into an AND gate with an inverted gate (FIG. 2B), parallel coupling into an OR gate (FIG. 2C), and series coupling into cascade coupling (FIG. 2D), respectively. FIGS. 6A and 6B are explanatory diagrams illustrating an example of creation of a GND side Boolean expression (Step 16). In a creation example 1 of a GND side Boolean expression illustrated in FIG. 6A, assuming a net18 at the GND as an output, the flow-through condition is created as follows, flow-through condition=net19 & net21.

In a creation example 2 illustrated in FIG. 6B, in a path from a net24 as a target net to a net22 at the GND as an output net, NMOSs 118 and 119 with the GND attribute are coupled in series, and an NMOS 120 with the GND attribute is coupled in parallel. Logic modeling is performed as illustrated in FIGS. 2A-2D and a flow-through condition is created as follows:

flow-through condition=net27 & (net28 & net24) |net26 & net24.

Figure 7A:
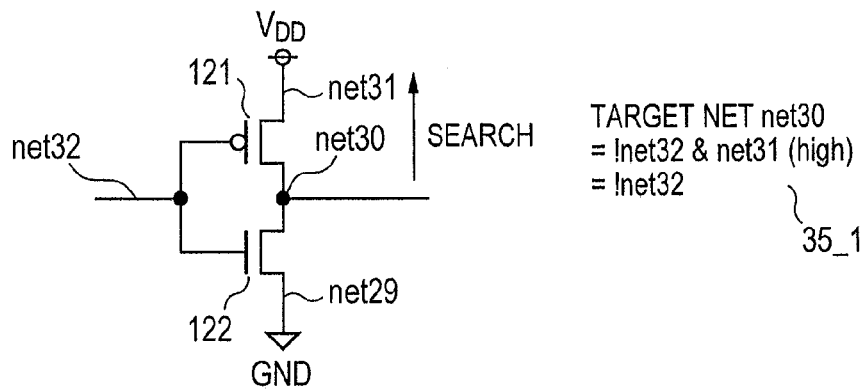
FIGS. 7A and 7B are explanatory diagrams illustrating an example of creation of a PWR side Boolean expression (Step 17)
Figure 7B:
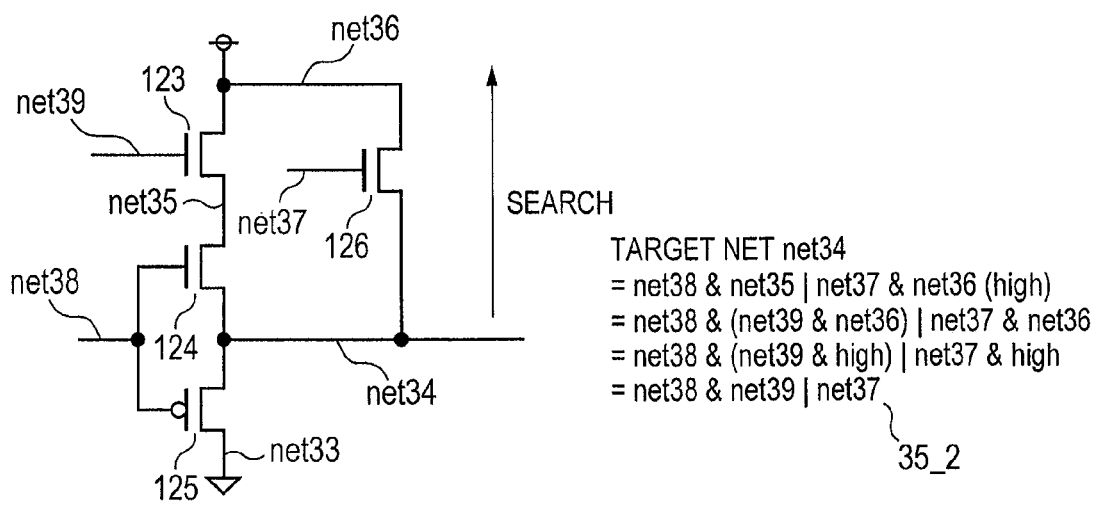

In the creation of the PWR side Boolean expression (Step 17), the search is made, starting from the target net, from a drain to a source or from a source to a drain of a transistor to which the PWR attribute or the SIG attribute is given. The search is continued until it reaches a power supply terminal such as the VDD, a terminal of a macroblock such as a logic gate or a memory, or an input/output port provided for the external of the LSI. The method of the logic modeling of a transistor passed in process of the search is as illustrated in FIGS. 2A-2D, and is the same as that of the creation of the GND side Boolean expression described above (Step 16). FIGS. 7A and 7B are explanatory diagrams illustrating an example of creation of a PWR side Boolean expression (Step 17). In the creation example 1 of the PWR side Boolean expression illustrated in FIG. 7A, a target net is created as follows, net30=!net32 & net31 (high)=!net32.

In the creation example 2 illustrated in FIG. 7B, in a path from a net34 as a target net, NMOSs 123 and 124 with the PWR attribute are coupled in series, and an NMOS 126 with the PWR attribute is coupled in parallel. When logic modeling is performed as illustrated in FIGS. 2A-2D, a target net is created as follows:

net34=net38 & net39|net37.

The logic search of a gate terminal of a transistor (Step 19) is explained.

Starting from a gate terminal of a transistor as an input of a GND side Boolean expression and a PWR side Boolean expression which configures a flow-through condition function, logic search is made for a circuit which supplies a signal for driving them, in the direction from an output terminal to an input terminal of a logic gate and from a drain terminal/a source terminal to a gate terminal of a transistor. The search terminates when the search reaches an external port of an LSI, a terminal of a macroblock such as a memory, and a power source or a grounding terminal. In addition, when the search reaches a joining net, the logic search of the path is terminated. The joining net here means a net at which a path of the logic search starting from a gate terminal of a transistor as an input of the GND side Boolean expression and a path of the logic search starting from a gate terminal of a transistor as an input of the PWR side Boolean expression cross.

The following explains the reason for terminating the logic search when the logic search reaches a joining net. When the flow-through condition determining Boolean expression has an output state which makes the outputs of both the GND side Boolean expression and the PWR side Boolean expression a logical value 1, there is a possibility that a flow-through current may be generated. Therefore, if the antinomy which makes one of the GND side Boolean expression and the PWR side Boolean expression a logical value 0, and makes the other a logical value 1 holds true, a flow-through current will not be generated. Since a joining net always exists in the netlist which produces the antinomy, when a joining net exists in the flow-through condition determining Boolean expression, it is possible to determine whether the antinomy holds true or not, by performing a Boolean operation from the joining net to the input of the GND side Boolean expression and the PWR side Boolean expression. Therefore, it is not necessary to make the logic search subsequent to the joining net.

The following explains extraction of the flow-through condition determining Boolean expression (Step 21). First, the search is made for the netlist from the joining net extracted at Step 20 to a gate terminal of a transistor as an input of the GND side Boolean expression and the PWR side Boolean expression, and a logic gate and a transistor passed by the search are extracted. Next, based on the function and connecting relation of the logic gate and the transistor which have been extracted, a Boolean expression with an input of other signals or a power source (VDD or GND) in the joining net and the path searched is created.

Figure 8:
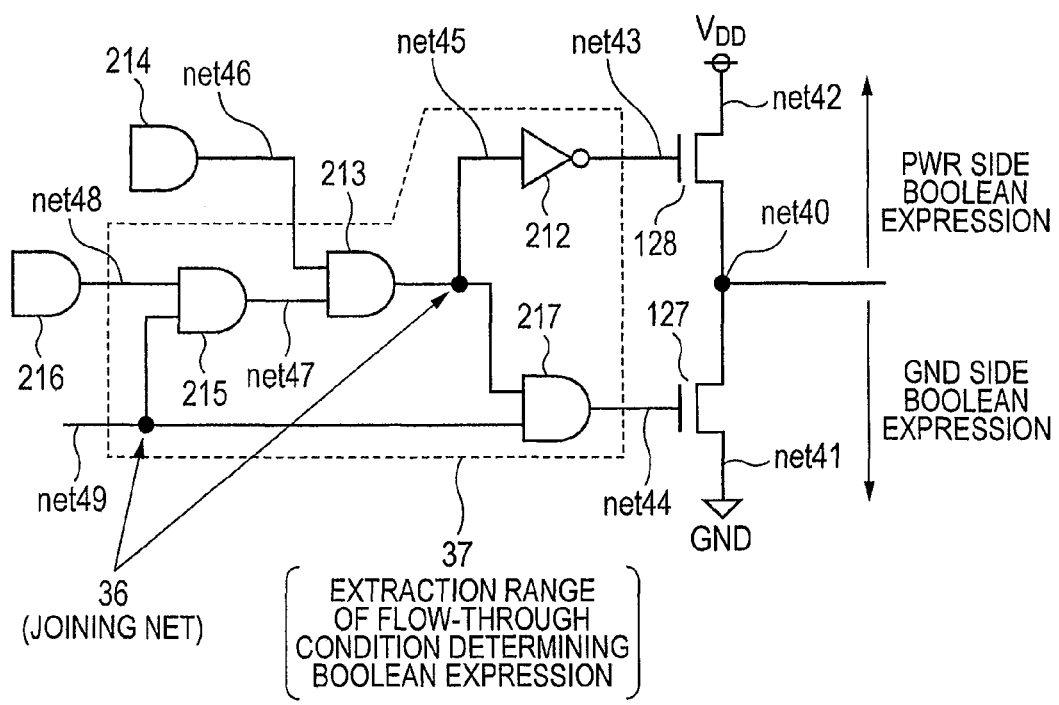
FIG. 8 is an explanatory diagram illustrating an example of extraction of a flow-through condition determining Boolean expression according to Embodiment 1.

FIG. 8 illustrates a concrete example of extraction of a flow-through condition determining Boolean expression. It is assumed that the PWR side Boolean expression is created at Step 16 of FIG. 4 and the GND side Boolean expression is created at Step 17 of FIG. 4, for a net40 as a target net.

First, the logic search for a gate terminal of a transistor is made (Step 19 of FIG. 4). Starting from a gate terminal net43 of a transistor 128 as an input of the PWR side Boolean expression, logic search is made for a circuit which supplies a signal for driving them, in the direction from an output terminal to an input terminal of a logic gate and in the direction from a drain terminal/a source terminal to a gate terminal of a transistor. In FIG. 8, an inverter 212, a net45, an AND 213, a net46, an AND 214, a net47, an AND 215, a net48, an AND 216, and a net49 are sequentially extracted in the search path. Actually, the logic search is terminated at a suitable number of stages. Next, starting from a gate terminal net44 of a transistor 127 as an input of the GND side Boolean expression, logic search is made for a circuit which supplies a signal for driving them, in the direction from an output terminal to an input terminal of a logic gate and in the direction from a drain terminal/a source terminal to a gate terminal of a transistor. In FIG. 8, an AND 217, the net45, and the net49 are sequentially extracted in the search path. Here, since the net45 and the net49 are already extracted by the path search starting from the gate terminal net43 of the transistor 128 as the input of the GND side Boolean expression described above, they are joining nets. Subsequent search is stopped when a joining net is discovered. Since the net45 is the joining net, the net46 is set to one of the inputs of the flow-through condition determining Boolean expression, and accordingly, the search subsequent to the AND 214 is not made. Even if the AND 214 is searched once in relation to the search sequence on the PWR side and the GND side, eventually it is removed from the flow-through condition determining Boolean expression. The net49 which is another path of the search from the GND side is also a joining net.

When the search reaches a terminal of a macroblock such as a memory, or an input/output port provided for the exterior of the LSI, without discovering a joining net at this time, an error indicating that there is a possibility that a flow-through current passing the target net under determination may be generated is outputted at the time, and the search shifts to determination of the next target net (Steps 20, 25, 24, and 13 of FIG. 4).

In the example illustrated in FIG. 8, the joining nets net45 and net49 are extracted; accordingly, a flow-through condition determining Boolean expression is extracted (Step 21), based on the function and connection of a logic gate and a transistor which have been extracted in the path by the path search at Step 19 starting from the joining nets net45 and net49.

In the example illustrated in FIG. 8, the flow-through condition function created at Step 18 is as follows, flow-through condition=net44 & (net43 & high).

The flow-through condition determining Boolean expression, which drives the net43 as the input of the PWR side Boolean expression, can be expanded as follows, flow-through condition = net44 & (net43 & high)

= net44 & (! net45 & high)

= net44 & (! (net46 & net47) & high)

= net44 & (! (net46 & (net48 & net49) & high.

Furthermore, the flow-through condition determining Boolean expression, which drives the net44 as the input of the GND side Boolean expression, can be expanded as follows, flow-through condition = net44 & (! (net46 & (net48 & net49)) & high)

= (net45 & net49) &

(! (net46 & (net48 & net49)) & high)

= ((net46 & (net48 & net49 & net49 &

(! (net46 & (net48 & net49)) & high)

Figure 9A:
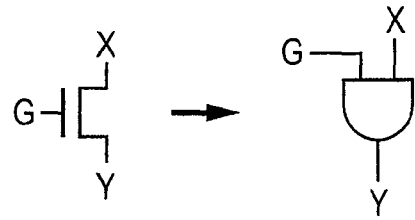
FIGS. 9A, 9B, 9C, and 9D are explanatory diagrams illustrating the conversion rule of a transistor to a logic gate in a logic search.
Figure 9B:
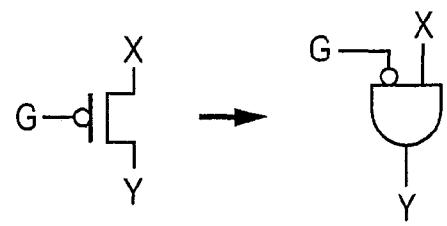
Figure 9C:
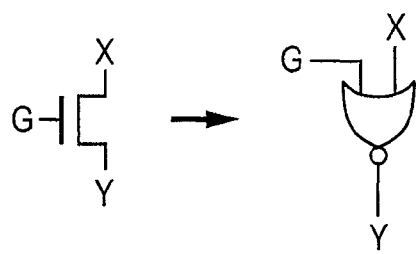
Figure 9D:
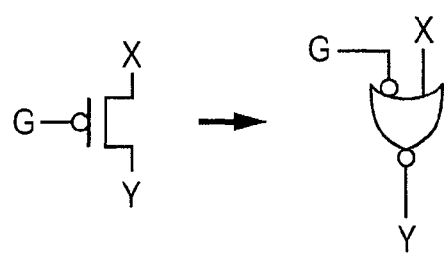
Figure 10A:
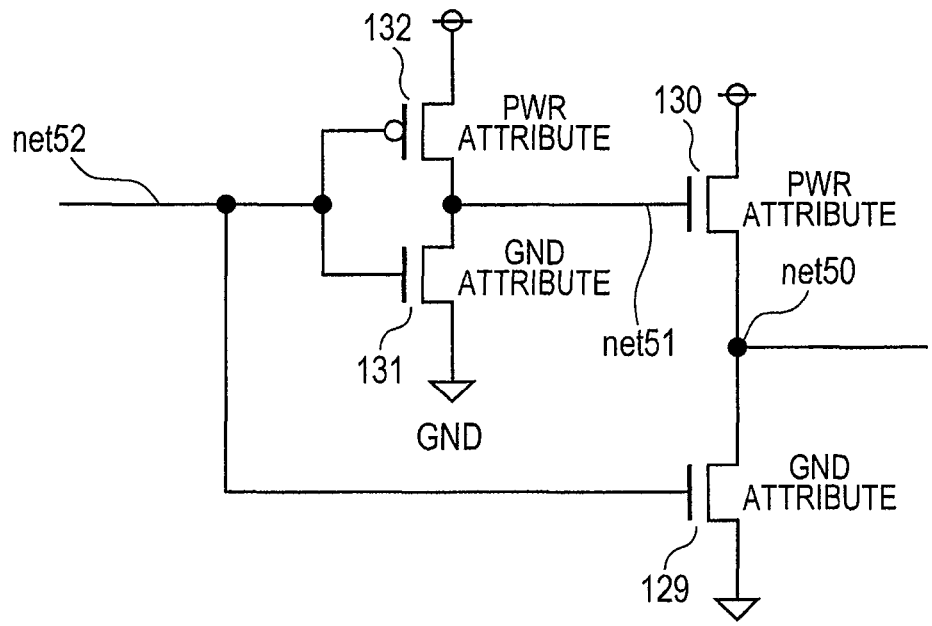
FIGS. 10A and 10B are drawings illustrating an example of conversion of a transistor to a logic gate in the logic search.
Figure 10B:
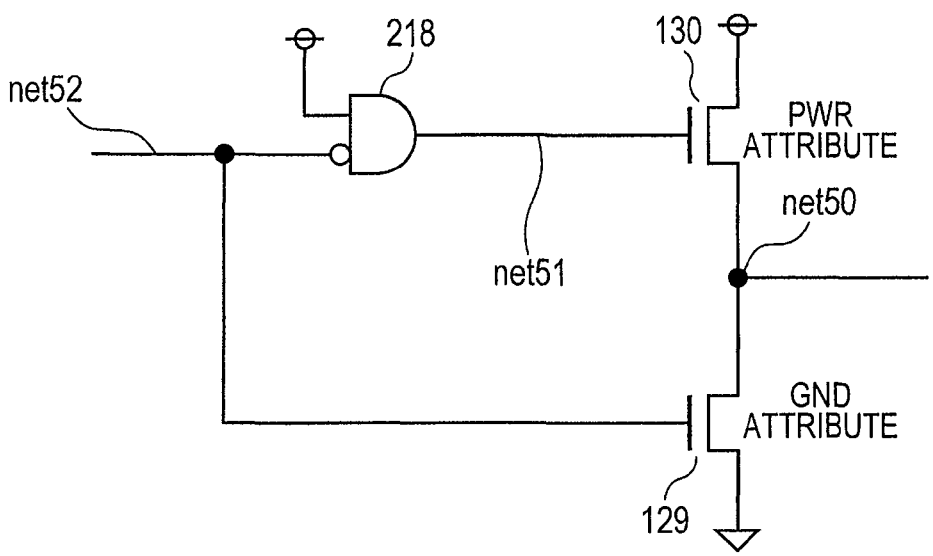

When a transistor is included in the netlist for which logic search is made, the transistor is replaced with a logic gate according to the rule illustrated in FIGS. 9A, 9B, 9C, and 9D, and the flow-through condition determining Boolean expression is extracted. FIGS. 9A, 9B, 9C, and 9D are explanatory diagrams illustrating the conversion rule of a transistor to a logic gate in the logic search. When a transistor has the PWR attribute or the SIG attribute, an NMOS is converted into an AND gate as illustrated in FIG. 9A, and a PMOS is converted into an AND gate with an inverted gate as illustrated in FIG. 9B. When a transistor has the GND attribute, an NMOS is converted into a NOR gate as illustrated in FIG. 9C, and a PMOS is converted into a NOR gate with an inverted gate as illustrated in FIG. 9D. FIGS. 10A and 10B illustrate an example of conversion of a transistor to a logic gate in the logic search. There are NMOSs 129 and 130 which configure a flow-through condition function, and an NMOS 131 and a PMOS 132 are coupled to a gate terminal (net51) of the NMOS 130, as illustrated in FIG. 10A. What is necessary is to take into consideration only the case where the net51 is set to high, since the NMOS configures the flow-through condition function in the present case. Therefore, as illustrated in FIG. 10B, the NMOS 131 of the GND attribute is not converted but the PMOS 132 of the PWR attribute is converted into an AND gate with one inverted input 218. Accordingly, it is possible to appropriately extract a Boolean expression also from the netlist including a transistor.

Alternatively, by determining that the NMOS 131 and the PMOS 132 coupled to the gate terminal (net51) of the NMOS 130 have a function equivalent to an inverter, they may be converted into an inverter coupling the net52 and the net51. In the present case, by determining equivalence with still more complicated logic gates, such as a buffer, OR, AND, NAND, NOR, EOR, and ENOR, conversion into an equivalent logic gate is also possible.

The following explains degeneration of a flow-through condition determining Boolean expression (Step 22 of FIG. 4). Hitherto, a flow-through condition function has been created (Step 18) and a flow-through condition determining Boolean expression which drives the flow-through condition function has been extracted (Step 21). Consequently, determination is made for the existence or nonexistence of the combination of an input pattern by which a logical value 1 is outputted to the GND terminal as an output of the flow-through condition function. As long as the Boolean expression is configured so that a logical value 0 is always outputted to the output of the flow-through condition function irrespective of the combination of input patterns, it is determined that there is no possibility that a flow-through current passing the target net is generated (Step 23). Otherwise, an error is outputted assuming that there is a possibility that a flow-through current may be generated (Step 25).

In advance of the determination (Step 23), the flow-through condition determining Boolean expression is degenerated (Step 22). The flow-through condition determining Boolean expression as extracted includes a redundant expression. Therefore, the flow-through condition determining Boolean expression is degenerated with logical equivalence maintained, in order to realize easy determination. Step 23 determines whether the output becomes a logical value 0 or a logical value 1. Therefore, it is possible to determine that, when the degeneration results in a logical value 0, there is no possibility that the flow-through current is generated, but when the degeneration does not result in a logical value 0, there is a possibility that the flow-through current may be generated.

In the example illustrated in FIG. 8, the flow-through condition obtained in the above is degenerated as follows. In the expression, flow-through condition=((net46 & (net48 & net49)) & net49) & (!(net46 & (net48 & net49)) & high), equating that net46 & (net48 & net49)=X, the following expression is obtained, flow-through condition=(X & net49) & (!X & high)=X & !X & net49.

Since X & !X=0, the following expression is obtained, flow-through condition=X & !X & net49=0.

Since the flow-through condition always becomes a logical value 0, it is determined that there is no possibility that the flow-through current passing the net40 is generated.

Figure 11:
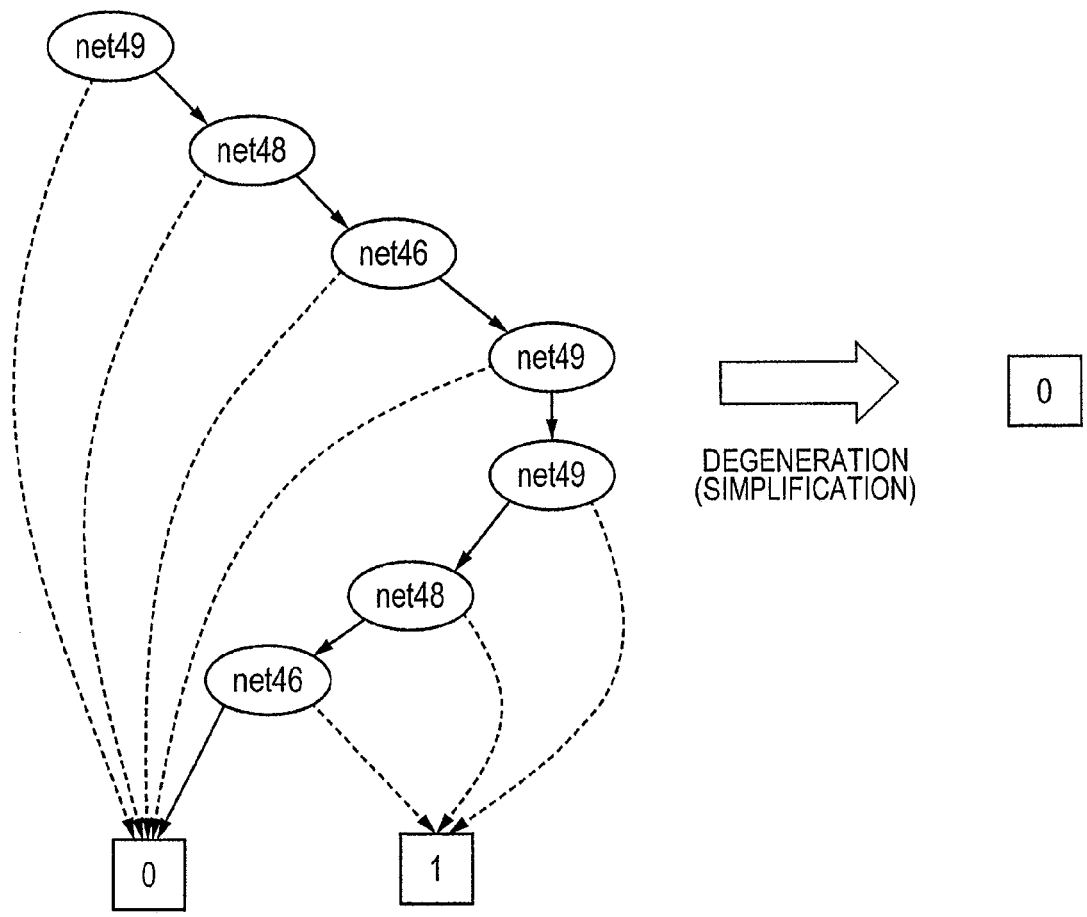
FIG. 11 is a drawing illustrating an example that a Boolean expression is expressed by a binary decision diagram (BDD).

For example, a binary decision diagram (abbreviated to BDD hereinafter) can be utilized for the degeneration of the Boolean expression. When the Boolean expression illustrated in FIG. 8 is represented in terms of the BDD, it will be expressed as illustrated in FIG. 11, for example. When the present expression is degenerated by the well-known BDD degeneration algorithm to obtain an irreducible BDD, it will become a BDD having only a logical value 0. The BDD before degeneration can take various topologies, even if they are logically equivalent. However, the BDD has features that the BDD in the irreducible state after repeated degeneration as much as possible can take only the unique topology. When the BDD is employed for degeneration of the Boolean expression of the present embodiment, it is possible to determine reliably whether a value other than a logical value 0 can be taken when degenerated to the irreducible state.

Embodiment 2

A simulation is executed by creating an input pattern which covers all the input conditions to the Boolean expression obtained by combining the flow-through condition function and the flow-through condition determining Boolean expression. When a logical value 1 is outputted at the output of the Boolean expression, it turns out that a flow-through current flows at that time. Accordingly, it is possible to identify an input pattern which generates a flow-through current, and it becomes easy to make the design change for preventing the generation of a flow-through current.

Embodiment 3

A Boolean expression obtained by combining the flow-through condition function and the flow-through condition determining Boolean expression is incorporated in the ordinary dynamic simulation, and the simulation is executed. From the simulation, it is possible to determine whether a flow-through current is generated within the range of the combination of the input signal assumed. Accordingly, it is possible to monitor the generation of a flow-through current in the ordinary dynamic simulation, and to carry on the design by treating the generation of a flow-through current equally with a logic bug, in the logical design stage. Therefore, it is possible to complete the circuit design which does not generate a flow-through current, at the same timing as the convergence of debugging in the logical design.

As described above, the invention accomplished by the present inventors has been concretely explained based on the embodiments. However, it cannot be overemphasized that the present invention is not restricted to the embodiments, and it can be changed variously in the range which does not deviate from the gist.

In the present specification, the positive logic is adopted in which a potential "high" is expressed by a logical value 1 and a potential "low" is expressed by a logical value 0. However, it is also preferable to adopt the negative logic instead.

What is claimed is:
1. An LSI design support device comprising:
a computer, wherein the computer is configured to:
receive input of a netlist of a circuit including a logic gate and an FET;
create a flow-through condition function in the netlist, by obtaining a Boolean expression indicative of function of a circuit of which an output is a source terminal or a drain terminal of a grounded FET;
create a flow-through condition determining Boolean expression, by extracting from the netlist a Boolean expression indicative of function of a partial netlist which supplies an input to the flow-through condition function;
obtain the flow-through condition function and the flow-through condition determining Boolean expression, by performing logic modeling in which, in the netlist, a power supply terminal is replaced with a logical value 1, a P-type FET is replaced with a logic gate which outputs to a drain a logical value inputted into a source when a logical value 0 is inputted to a gate, and an N-type FET is replaced with a logic gate which outputs to a source a logical value inputted into a drain when a logical value 1 is inputted to a gate; and
determine occurrence or non-occurrence of the logic state of the netlist which generates a steady-state flow-through current in a grounded FET included in the netlist, by determining existence of the conditions in which a logical value 1 is outputted from the flow-through condition function, based on the result of having degenerated the flow-through condition determining Boolean expression with the logical equivalence maintained.

2. The LSI design support device according to claim 1,
wherein a signal net coupled only to a source or a drain of a plurality of FETs among a plurality of signal nets included in the netlist is defined as a target net,
wherein for each of all the target nets, a path which starts from the target net, passes through a path from a drain to a source of an FET, and reaches a ground net is extracted, the logic modeling is performed to the FET in the path, and a GND side Boolean expression, which describes a gate of the FET in the path and the target net as an input and the ground net as an output, is extracted,
wherein a path which starts from the target net, passes through a path from a drain to a source of an FET, and reaches a power net or a signal net coupled to other than an FET is extracted, the logic modeling is performed to the FET in the path, and a PWR side Boolean expression, which describes a gate of an FET in the path as an input and the target net as an output, is extracted, and
wherein a Boolean expression obtained by combining the GND side Boolean expression and the PWR side Boolean expression with the target net is defined as the flow-through condition function, and when there exists a condition under which both the PWR side Boolean expression and the GND side Boolean expression become a logical value 1, it is determined that there exists a logic state of the netlist which generates a steady-state flow-through current.

3. The LSI design support device according to claim 2,
wherein, starting from a signal net as the input of the GND side Boolean expression and the PWR side Boolean expression, a path search is performed for the netlist in the direction from an output terminal to an input terminal of a logic gate, or in the direction from a drain or a source to a gate of an FET, and a Boolean expression indicative of the function and connecting relation of a logic gate or an FET on the path is extracted and defined as the flow-through condition determining Boolean expression, and
wherein, when the path search reaches a joining net at which a path searched in the path search starting from the signal net as the input of the GND side Boolean expression and a path searched in the path search starting from the signal net as the input of the PWR side Boolean expression join, the path search subsequent to the joining net is stopped.

4. The LSI design support device according to claim 3, wherein, when the joining net is not extracted as a result of performing the path search of the specified number of stages, it is determined that there exists a logic state of the netlist which generates a steady-state flow-through current in the flow-through current path passing through the target net.

5. The LSI design support device according to claim 3, wherein a Boolean expression obtained by combining the flow-through condition function and the flow-through condition determining Boolean expression is degenerated with the logical equivalence maintained, and when the Boolean expression for which further degeneration is impracticable shows a value other than a logical value 0, it is determined that there exists a logic state of the netlist which generates a steady-state flow-through current.

6. The LSI design support device according to claim 5, wherein the Boolean expression obtained by combining the flow-through condition function and the flow-through condition determining Boolean expression is expressed by means of a binary decision diagram.

7. The LSI design support device according to claim 3, wherein a logic simulation is performed by inputting all the combination patterns of the input conditions to the Boolean expression obtained by combining the flow-through condition function and the flow-through condition determining Boolean expression, and when there exists a combination of the input conditions under which the Boolean expression outputs a logical value 1, it is determined that there exists a logic state of the netlist which generates a steady-state flow-through current.

8. The LSI design support device according to claim 3, wherein the Boolean expression obtained by combining the flow-through condition function and the flow-through condition determining Boolean expression is incorporated in a dynamic simulation to the netlist.

9. An LSI design method for inputting a netlist of a circuit including a logic gate and a FET and for determining by a computer the occurrence or non-occurrence of a logic state of the netlist which generates a steady-state flow-through current in a grounded FET included in the netlist, the LSI design method comprising:
a first step for creating a flow-through condition function in the netlist, by obtaining a Boolean expression indicative of function of a circuit of which an output is a source terminal or a drain terminal of a grounded FET;
a second step for creating a flow-through condition determining Boolean expression, by extracting from the netlist a Boolean expression indicative of function of a partial netlist which supplies an input to the flow-through condition function; and
a third step for determining occurrence or non-occurrence of the logic state of the netlist which generates a steady-state flow-through current in the grounded FET included in the netlist, by determining existence of the conditions in which a logical value 1 is outputted from the flow-through condition function, based on the result of having degenerated the flow-through condition determining Boolean expression with the logical equivalence maintained,
wherein the first step and the second step comprise respectively a step for performing logic modeling in which, in the netlist, a power supply terminal is replaced with a logical value 1, a P-type FET is replaced with a logic gate which outputs to a drain a logical value inputted into a source when a logical value 0 is inputted to a gate, and an N-type FET is replaced with a logic gate which outputs to a source a logical value inputted into a drain when a logical value 1 is inputted to a gate.

10. The LSI design method according to claim 9, wherein a signal net coupled only to a source or a drain of a plurality of FETs among a plurality of signal nets included in the netlist is defined as a target net, and the first step, the second step, and the third step are repeatedly executed for each of all the target nets,
wherein the first step comprises the steps of:
extracting a path which starts from the target net, passes through a path from a drain to a source of a FET, and reaches a ground net, performing the logic modeling to the FET in the path, and extracting a GND side Boolean expression which describes a gate of the FET in the path and the target net as an input and the ground net as an output;
extracting a path which starts from the target net, passes through a path from a drain to a source of an FET, and reaches a power net or a signal net coupled to other than an FET, performing the logic modeling to the FET in the path, and extracting a PWR side Boolean expression which describes a gate of the FET in the path as an input and the target net as an output; and
defining a Boolean expression obtained by combining the GND side Boolean expression and the PWR side Boolean expression with the target net as the flow-through condition function, and
wherein the third step determines that there exists a logic state of the netlist which generates a steady-state flow-through current, when there exists a condition under which both the PWR side Boolean expression and the GND side Boolean expression become a logical value 1.

11. The LSI design method according to claim 10, wherein the second step comprises the steps of:
performing a path search for the netlist, starting from a signal net as the input of the GND side Boolean expression and the PWR side Boolean expression, in the direction from an output terminal to an input terminal of a logic gate, or in the direction from a drain or a source to a gate of an FET, extracting a Boolean expression indicative of the function and connecting relation of a logic gate or an FET on the path, and defining it as the flow-through condition determining Boolean expression; and
stopping the path search subsequent to a joining net, when the path search reaches the joining net at which a path searched in the path search starting from the signal net as an input of the GND side Boolean expression and a path searched in the path search starting from the signal net as an input of the PWR side Boolean expression join.

12. The LSI design method according to claim 11, further comprising:
a fourth step of determining that there exists a logic state of the netlist which generates a steady-state flow-through current in the flow-through current path passing through the target net, when the joining net is not extracted as a result of performing the path search of the specified number of stages.

13. The LSI design method according to claim 11, further comprising:
a fifth step of degenerating a Boolean expression obtained by combining the flow-through condition function and the flow-through condition determining Boolean expression with the logical equivalence maintained, wherein the third step determines that there exists a logic state of the netlist which generates a steady-state flow-through current, when the Boolean expression for which further degeneration in the fifth step is impracticable shows a value other than a logical value 0.

14. The LSI design method according to claim 13, wherein the Boolean expression obtained by combining the flow-through condition function and the flow-through condition determining Boolean expression is expressed by means of a binary decision diagram.

15. The LSI design method according to claim 11, further comprising:

a sixth step of performing a logic simulation to the Boolean expression obtained by combining the flow-through condition function and the flow-through condition determining Boolean expression, by inputting all the combination patterns of the input conditions, wherein the third step determines that there exists a logic state of the netlist which generates a steady-state flow-through current, when there exists a combination of the input conditions under which the Boolean expression outputs a logical value 1.

16. The LSI design method according to claim 11, wherein the Boolean expression obtained by combining the flow-through condition function and the flow-through condition determining Boolean expression is incorporated in a dynamic simulation to the netlist.

* * * * *